United States Patent [19]

Uragami et al.

[11] Patent Number: 4,694,203
[45] Date of Patent: Sep. 15, 1987

[54] HIGH SPEED BI-COMOS SWITCHING CIRCUIT

[75] Inventors: Akira Uragami, Takasaki; Yukio Suzuki, Hinode; Masahiro Iwamura; Ikuro Masuda, both of Hitachi, all of Japan

[73] Assignee: Hitachi, Ltd., Tokyo, Japan

[21] Appl. No.: 716,151

[22] Filed: Mar. 26, 1985

[30] Foreign Application Priority Data

Mar. 26, 1984 [JP] Japan .................................. 59-56033

[51] Int. Cl.$^4$ .................. H03K 19/013; H03K 19/017
[52] U.S. Cl. ...................................... 307/446; 307/443; 307/448; 307/570; 307/270
[58] Field of Search ................ 307/443, 446, 448, 450, 307/480, 481, 570, 270, 300, 303

[56] References Cited

U.S. PATENT DOCUMENTS 4,558,234 12/1985 Suzuki et al. .................... 307/443 X

FOREIGN PATENT DOCUMENTS 0025424 2/1984 Japan .................................. 307/446

OTHER PUBLICATIONS

Lin et al., "Complementary MOS-Bipolar Transistor Structure, IEEE Ted, vol. Ed-16, No. 11, Nov. 1969, pp. 945-951.

Primary Examiner—Stanley D. Miller
Assistant Examiner—D. R. Hudspeth
Attorney, Agent, or Firm—Antonelli, Terry & Wands

[57] ABSTRACT

A bipolar/CMOS mixed type switching circuit comprising two npn-type bipolar transistors $Q_1$, $Q_2$ that are connected in the form of a totem pole in the output stage, a CMOS inverter and an NMOSFET $M_3$ for driving these transistors in a complementary manner, and resistance means R for discharging the electric charge stored in the base of the transistor $Q_2$. The threshold voltage of an NMOSFET $M_2$ constituting the CMOS inverter in the absence of substrate effect is set to be substantially equal to the threshold voltage of the NMOSFET $M_3$ in the absence of the substrate effect, and the channel conductance $W_N/L_N$ of the NMOSFET $M_3$ is so set that the threshold voltage $V_{LT1}$ of the CMOS inverter and the practical threshold voltage $V_{LT2}$ of the NMOSFET $M_3$ will be nearly the same. Owing to the above structure, there is obtained a switching circuit which permits little through current to flow and which operates at high speeds.

9 Claims, 7 Drawing Figures

HIGH SPEED BI-COMOS SWITCHING CIRCUIT

BACKGROUND OF THE INVENTION

The present invention relates to a switching circuit.

A composite technique has been developed to form different kinds of elements in a single semiconductor substrate, to obtain a semiconductor integrated circuit having diverse functions and a high degree of integration.

For instance, a circuit technique for combining bipolar transistors with insulated gate-type fieldeffect transistors (hereinafter referred to as MOSFET's) has been disclosed in Japanese Patent Publication No. 43997/1972 and in Japanese Patent Laid-Open No. 26181/1977.

FIG. 1 shows a switching circuit which was contrived by the inventors of the present invention and in which a bipolar transistor and an insulated gate-type field effect transistor are combined. (See U.S. Pat. Ser. No. 513,056 which is hereby incorporated by reference.) The circuit shown in FIG. 1 is an input buffer circuit (switching circuit) used for, for example, in a Bi-CMOS (bipolar/CMOS mixed type) gate array. The circuit consists of two bipolar transistors Q1, Q2 that constitute an output stage, a CMOS inverter 12 which drives the bipolar transistor Q1 in an inverted manner, and a buffer amplifier (voltage follower) 14 which drives the other bipolar transistor Q2 in a non-inverted manner.

This circuit operates as described below. A logic signal applied to an input terminal IN is divided into two branches. One part of the input is phase inverted by the CMOS inverter 12 and is input to the base of the transistor Q1 of the output stage. The other part of the input is converted into a low impedance by the buffer amplifier 14 and is input in phase to the base of the other bipolar transistor Q2 of the output stage. Therefore, the two bipolar transistors Q1, Q2 in the output stage are rendered conductive and are driven in a complementary manner. When one transistor Q1 is ON (conductive) and the other transistor Q2 is OFF (nonconductive), a changing current is supplied to the load Co through the transistor Q1. When one transistor Q1 is OFF and the other transistor Q2 is ON, the electric charge stored in the load Co is discharged through the other transistor Q2. Accordingly, the capacitive load Co is driven in this fashion.

The switching circuit has the features (effects) described below.

(1) The CMOS inverter 12 and the buffer amplifier circuit 14 have nearly the same signal transmission speed; hence, the bases of the two transistors Q1, Q2 are driven nearly at the same timing in an opposite phase relation. Therefore, the two transistors Q1, Q2 are turned on simultaneously for only a short time, making it possible to decrease the through current.

(2) The two transistors Q1, Q2, which are of the npn-type, can be used to constitute the output stage. When a semiconductor integrated circuit is constructed, therefore, a high cut-off frequency $f_T$ can be easily obtained to realize a high operation speed.

(3) When the bipolar transistor Q1 in the output stage is turned off, the electric charge accumulated in the base thereof can be quickly extracted through a MOSFET M2 of the CMOS inverter 12. When the other bipolar transistor Q2 in the output stage is turned off, the electric charge accumulated in the base thereof can be quickly extracted by a low-impedance output of the voltage follower 14. That is, the two bipolar transistors Q1, Q2 in the output stage, respectively, have paths for effectively extracting the electric charge accumulated in the bases. Therefore, the switching time from ON to OFF is conspicuously shortened.

(4) Since a power source terminal p1 of the voltage follower 14 is connected to the output terminal OUT, the discharging current of the capacitive load Co connected to the output terminal OUT flows not only to the other transistor Q2 in the output stage but also to the voltage follower 14 as an operation current from the first power source terminal p1. At the moment when the logic state of the buffer output OUT changes from "H" (high logic level) to "L" (low logic level), the electric charge stored in the load Co is allowed to discharge through the transistor Q2 and the voltage follower 14. Therefore, the driving power is greatly reinforced for the capacitive load Co, especially at the moment of breaking.

(5) Further, since the CMOS inverter 12 and the voltage follower 14 have high input impedances, there is obtained a high input impedance as viewed from the input side.

(6) The first power source terminal p1 of the voltage follower 14 is connected not to the power source $V_{DD}$ but to the collector (output terminal OUT) of the transistor Q2 of the output stage, and the base potential of the transistor Q2 is not higher than the collector potential thereof. Therefore, the transistor Q2 is not saturated.

The switching circuit exhibits excellent features as described above. Further study of the problem enabled the inventors to realize the switching circuit in the form of an integrated circuit. They have found that in designing constants for the circuit, many contrivances are necessary to satisfy the high-speed characteristics and the low power consumption that are strictly necessary for the switching circuit. The present invention was achieved through the above study.

SUMMARY OF THE INVENTION

The object of the present invention is to provide a novel switching circuit having high performance, that can be suitably realized in the form of a semi-conductor integrated circuit.

The switching circuit is constructed as described below.

(1) The circuit comprises two npn-type bipolar transistors $Q_1$, $Q_2$ in the output stage connected in the form of a totem pole, CMOS inverters $M_1$, $M_2$ for driving the base of the transistor $Q_1$, a source follower $M_3$ for driving the base of the transistor $Q_2$, a resistor R of which the one end is commonly connected to the base of the transistor $Q_2$ and to the source of the source follower $M_3$, and an input signal terminal commonly connected to the gate of the source follower $M_3$ and to the gate of the CMOS inverters $M_1$, $M_2$.

(2) A threshold voltage $V_{thNO}$ of n-channel MOSFET's constituting the CMOS inverters is selected to be substantially equal to a threshold voltage $V_{thNO}$ of the MOSFET (source follower) $M_3$. Here, the threshold voltage $V_{thNO}$ stands for that of the n-channel MOSFET when there is no substrate effect.

(3) Resistance of the resistor R is selected to lie over a predetermined range in order to set the turn-on time and the turn-off time of the NPN bipolar transistor $Q_2$ to be shorter than a predetermined value.

(4) The channel conductance Wn/Ln of the source follower $M_3$ has been so set that the threshold voltage $V_{LT2}$ of the source follower $M_3$ will be close to the threshold voltage $V_{LT1}$ of the CMOS inverters. Here, Ln denotes gate length, and Wn denotes gate width.

Owing to the above-mentioned structure, a high-speed switching circuit which permits little through current to flow can be obtained without increasing the complexity of IC manufacturing.

DESCRIPTION OF THE PREFERRED EMBODIMENTS

Embodiment 1

Figure 1:
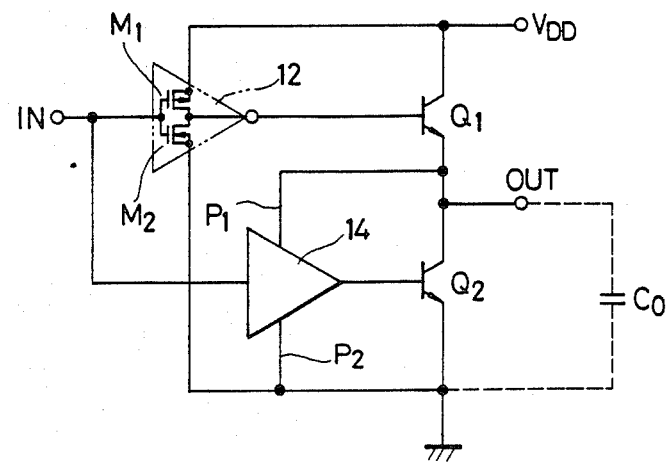
FIG. 1 is a circuit diagram showing fundamental circuit structure of the switching circuit that serves as a prerequisite of the present invention.
Figure 2:
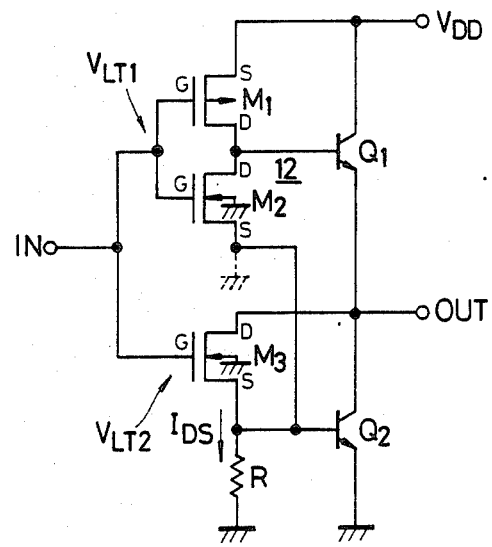
FIG. 2 shows structure of the switching circuit according to the first embodiment of the present invention.

FIG. 2 is a circuit diagram which concretely illustrates a first embodiment of the present invention.

The present invention was achieved through the study of how to reduce the through current of the switching circuit, how to increase the signal transmission speed, and how to realize the switching circuit in the form of a semiconductor integrated circuit.

Therefore, the progress of study by the inventors will first be described below, and the features of the present invention will then be described.

The circuit shown in FIG. 2 was studied by the inventors through the process as mentioned below.

I. Consideration of logic threshold voltage $V_{LT1}$ of the CMOS inverter 12:

The substrate effect takes place if the source S of NMOS-FET $M_2$ is connected to the base of the transistor $Q_2$ as indicated by a solid line. Here, the term "substrate effect" means that if the source potential so changes as to become higher than or lower than the ground potential while the potential of the silicon substrate has been fixed to ground potential, the practical threshold voltage of the MOSFET changes depending upon the change in the source potential. If the substrate effect is taken into consideration, therefore, the threshold voltage $V_{thN}$ of NMOSFET $M_2$ in practice is given by the following well-known equation:

$$V_{thN} = V_{thNO} + \Delta V_{th} \quad (1)$$

$$= V_{thNO} + K(\sqrt{2\phi_F - V_{BS}} - \sqrt{2\phi_F})$$

$$= V_{thNO} + K(\sqrt{2\phi_F + V_{BE}} - \sqrt{2\phi_F})$$

where $V_{thNO}$ denotes threshold voltage when there is is no substrate effect, $\Delta V_{th}$ denotes shifted amount caused by the substrate effect, K denotes a constant, $2\phi_F$ denotes voltage that is twice as great as the Fermi potential $\phi_F$, $V_{BS}$ denotes voltage across the substrate and the source of the NMOSFET $M_2$, and $V_{BE}$ denotes voltage across the base and the emitter of the transistor $Q_2$.

Next, $$\alpha = \sqrt{\frac{\beta_P}{\beta_N}} = \sqrt{\frac{\beta_{PO} \cdot \frac{W_P}{L_P}}{\beta_{NO} \cdot \frac{W_N}{L_N}}}$$

is defined below.

In the above equation, $\beta_P$ and $\beta_N$ denote conductance (constant) of the p-channel MOSFET and conductance of the n-channel MOSFET, respectively, and $\beta_{PO}$ and $\beta_{NO}$ denote values of $\beta_P$ and $\beta_N$, respectively, when W/L=1 (where W is gate width and L is gate length).

Then, a logic threshold voltage $V_{LT1}$ of the CMOS inverter 12 is given by, $$V_{LT1} = \frac{\alpha(V_{DD} + V_{thPO}) + V_{thN} + V_{BE}}{1 + \alpha} \quad (2)$$

$$= \frac{\alpha(V_{DD} + V_{thPO}) + V_{thNO} + K(\sqrt{2\phi_F + V_{BE}} - \sqrt{2\phi_F}) + V_{BE}}{1 + \alpha}$$

where $V_{DD}$ is power source voltage, and $V_{thPO}$ denotes the threshold voltage of PMOSFET $M_1$ when there is no substrate effect.

Generally, $\alpha$ is set to a suitable value to so design the circuit that $V_{LT1} \approx \frac{1}{2} V_{DD}$ (note here that the symbol $\approx$ is used to indicate "substantially equal to"). Here, the threshold voltage $V_{LT1}$ of the CMOS inverter stands for a gate voltage applied to the CMOS inverter when an electric current flows substantially equally into the PMOSFET $M_1$ and NMOSFET $M_2$ that constitute the CMOS inverter.

II. Consideration of the logic threshold voltage $V_{LT2}$ of the NMOS source follower circuit:

It is assumed for purposes of beginning the analysis that the logic threshold voltage $V_{LT2}$ for turning the NMOSFET $M_3$ and the transistor $Q_2$ from off to on, is $$V_{LT2} \approx V_{thN} + V_{BE} \quad (3)$$

$$\approx V_{thNO} + V_{BE}$$

III. Consideration of through currents of the transistors $Q_1$, $Q_2$:

To prevent the flow of through currents of the transistors $Q_1$, $Q_2$, the relation $V_{LT1} \approx V_{LT2}$ must hold true. If $V_{DD}=5$ volts, $V_{LT1} \approx 2.5$ volts. In order for the logic threshold voltage $V_{LT2}$ to be 2.5 volts when $V_{BE}=0.6$ volt, it is necessary to implant impurity ions into the channel region of the NMOSFET $M_3$, so that $V_{thNO}$ will become 1.9 volts. Here, $V_{thPO}$ of $M_1$ is $-0.6$ volt and $V_{thNO}$ of $M_2$ is $+0.6$ volt. To set the threshold voltage $V_{thNO}$ of NMOSFET $M_3$ to 1.9 volts, therefore, the individual MOSFET's, $M_2$ and $M_3$ must be formed through individual processes, or must be formed through processes that are partly common to each other; then, the desired threshold voltages of each of the MOSFET's must be obtained through additional processes.

Figure 3:
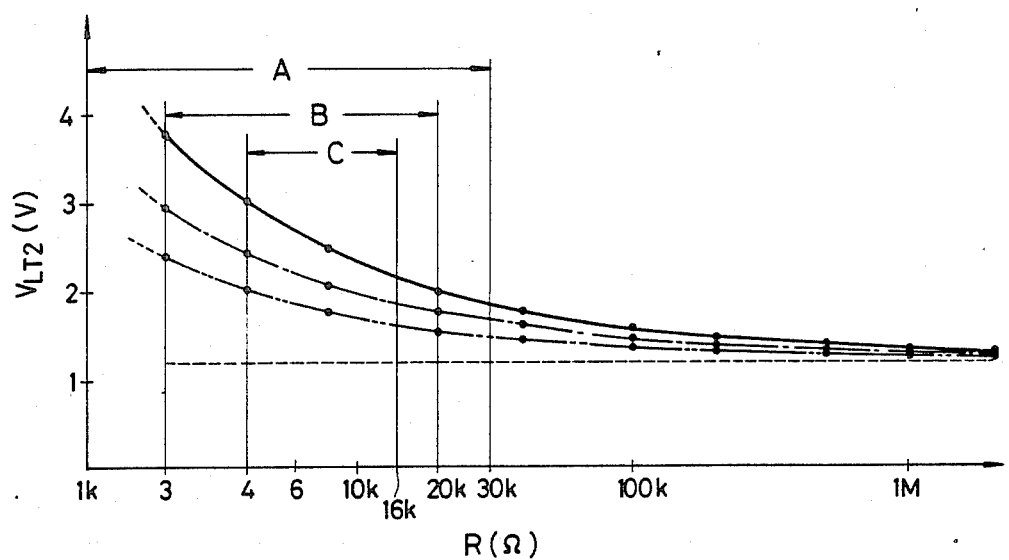
FIG. 3 is a diagram showing the relation between the resistance of the resistor R and the threshold voltage $V_{LT2}$ of the source follower circuit.

IV. Consideration of the NMOS source follower $M_3$ and the logic threshold voltage $V_{LT2}$ of the transistor $Q_2$:

The inventors have furthered the study concerning the logic threshold voltage $V_{LT2}$, and have found the fact that the logic threshold voltage $V_{LT2}$ is not simply found from the equation (3) above but varies with the resistance of the resistor R as well as $\beta_{NO}$ of NMOSFET $M_3$ and $W_N/L_N$ of NMOSFET $M_3$, as shown in FIG. 3.

The reason why the logic threshold voltage $V_{LT2}$ varies according to the relation shown in FIG. 3 will be analyzed below.

Here, if $$\beta_N = \beta_{NO} \cdot \frac{W_N}{L_N},$$

the current that flows through the drain-source path of the NMOSFET $M_3$ is:

$$I_{DS} = \frac{\beta_N}{2}(V_{GS} - V_{thN})^2 \quad (4)$$

where $V_{GS}$ denotes the voltage across the gate and the source of NMOSFET $M_3$.

Input voltage $V_{IN}$ at the input terminal IN is:

$$V_{IN} = V_{GS} + R \cdot I_{DS} \quad (5)$$

The transistor $Q_2$ is rendered conductive when the voltage drop $R \cdot I_{DS}$ of the resistor R satisfies the following equation:

$$V_{BEQ2} = R \cdot I_{DS} \quad (6)$$

From equations (5), (6), there is obtained, $$V_{GS} = V_{IN} - V_{BE} \quad (7)$$

From equations (4), (7), there is further obtained, $$I_{DS} = \frac{\beta_N}{2}(V_{IN} - V_{BE} - V_{thN})^2 \quad (8)$$

If both sides of the equation (8) are multiplied by R, and if $V_{BE} = R \cdot I_{DS}$ is taken into consideration, there is obtained the following equation:

$$V_{BE} = R \cdot I_{DS} = \frac{\beta_N \cdot R}{2}(V_{IN} - V_{BE} - V_{thN})^2 \quad (9)$$

By modifying equation (9), there is obtained, $$\frac{2V_{BE}}{\beta_N \cdot R} = V_{IN}^2 + V_{BE}^2 + V_{thN}^2 - 2V_{IN} \cdot V_{BE} + 2V_{BE} \cdot V_{thN} - 2V_{thN} \cdot V_{IN} \quad (10)$$

By modifying equation (10), there is further obtained, $$V_{IN}^2 - 2(V_{BE} + V_{thN}) \cdot V_{IN} + (V_{BE} + V_{thN})^2 - \frac{2V_{BE}}{\beta_N \cdot R} = 0 \quad (11)$$

If $V_{IN}$ is solved, $$V_{LT2} = V_{IN} = \frac{2(V_{BE} + V_{thN}) \pm \sqrt{4(V_{BE} + V_{thN})^2 - 4\left\{(V_{BE} + V_{thN})^2 - \frac{2V_{BE}}{\beta_N \cdot R}\right\}}}{2} \quad (12)$$

$$= V_{BE} + V_{thN} + \sqrt{\frac{2V_{BE}}{\beta_{NO} \cdot \frac{W_N}{L_N} \cdot R}}$$

From equation (12), it will be understood that the logic threshold voltage $V_{LT2}$ also varies depending upon $\beta_{NO}$, $W_N/L_N$ and R. FIG. 3 shows the relation between the resistance of the resistor R and the threshold voltage $V_{LT2}$ of the NMOSFET $M_3$ relying upon the results measured according to the present invention, wherein a solid line represents the relation when $W_N/L_N = 10\mu m/2\mu m$, a dot-dash chain line represents the relation when $W_N/L_N = 20/2$, and a two-dot chain line represents the relation when $W_N/L_N = 40/2$.

Figure 4:
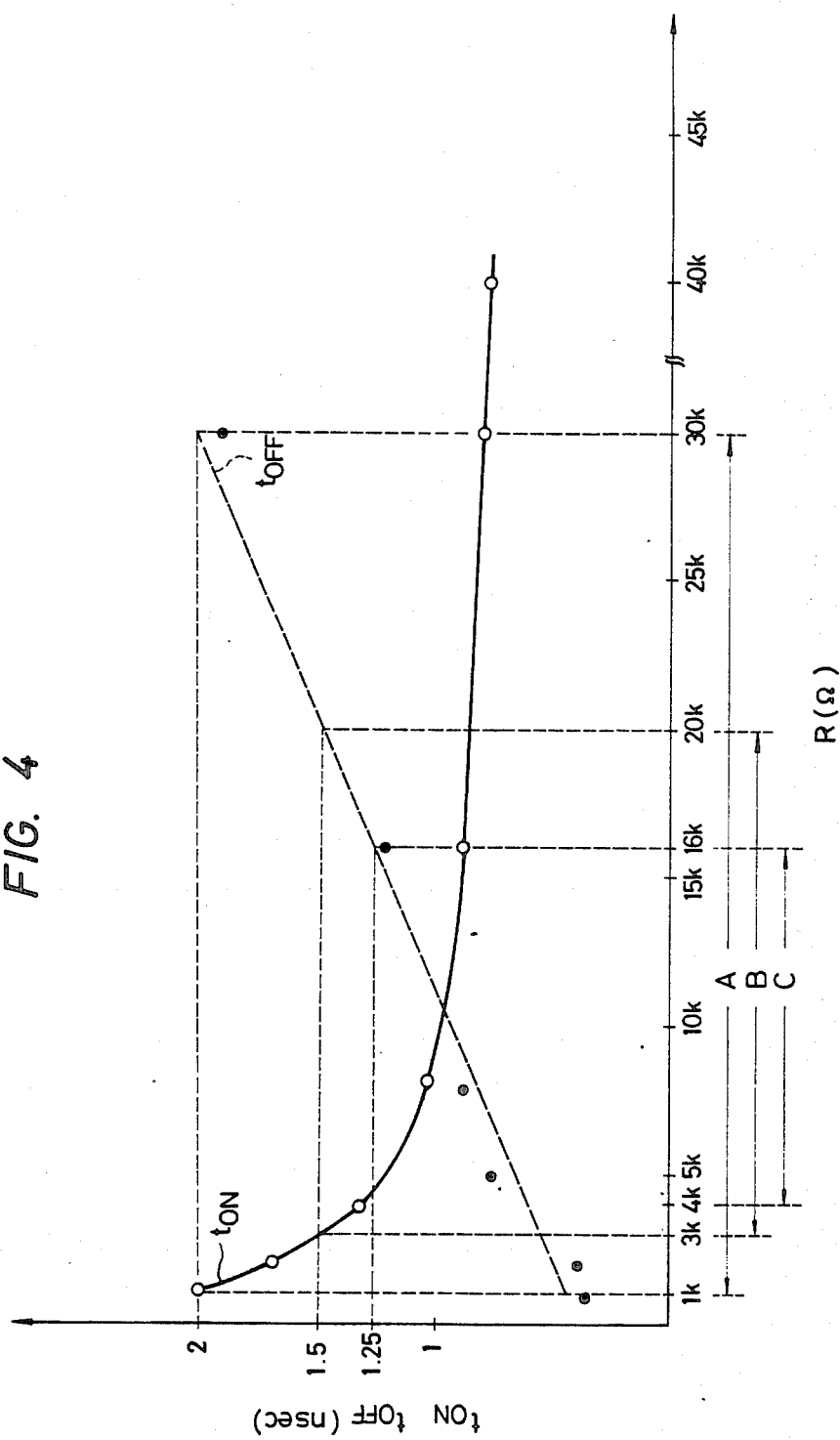
FIG. 4 is a diagram showing the relation between the resistance of the resistor R and the turn-on and turn-off times of the bipolar transistor Q2.

V. Consideration of the relation between the resistance of the resistor R and turn-on time $t_{ON}$ and turn-off time $t_{OFF}$ of the transistor $Q_2$:

FIG. 4 shows the relation between the resistance of the resistor R and $t_{ON}$, $t_{OFF}$, that is practically examined.

In FIG. 4, the solid line represents the turn-on time $t_{ON}$, and a dotted line represents the turn-off time $t_{OFF}$.

The following facts will be understood from FIG. 4.

(1) To set $t_{ON}$ and $t_{OFF}$ to be shorter than 2 nsec., the resistance must be selected to be $1K\Omega < R < 30K\Omega$ (range A).

(2) To set $t_{ON}$ and $t_{OFF}$ to be shorter than 1.5 nsec., the resistance must be selected to be $3K\Omega < R < 20K\Omega$ (range B).

(3) To set $t_{ON}$ and $t_{OFF}$ to be shorter than 1.25 nsec., the resistance must be selected to be $4K\Omega < R < 16K\Omega$ (range C).

In the foregoing were mentioned the results studied by the inventors. The specific construction of the circuit shown in FIG. 2 will further be described below.

In FIG. 2, the source S of the n-channel MOSFET $M_2$ may be either grounded as indicated by a dotted line or be connected to the base of the transistor $Q_2$ as indicated by a solid line. When the source of the NMOSFET $M_2$ is connected to the base of the transistor $Q_2$, however, it becomes difficult to design the threshold voltage $V_{LT1}$, of the CMOS inverter 12. When the source of the NMOSFET $M_2$ is grounded, it is easy to design the threshold voltage $V_{LT1}$.

The circuit of FIG. 2 is designed in four steps:

Step 1: The threshold voltage $V_{thNO}$ of NMOSFET $M_2$ is set to be substantially equal to the threshold voltage $V_{thNO}$ of NMOSFET $M_3$. For instance, NMOSFET $M_2$, $M_3$ are formed on the same chip by the same manufacturing process.

Step 2: The resistance R is set to lie within a predetermined range to set $t_{ON}$ and $t_{OFF}$ of the transistor $Q_2$ to be shorter than a predetermined value. For instance, to set $t_{ON}$, $t_{OFF}$ to be shorter than 2 nsec., the resistance R is selected to lie within the aforementioend range A.

Step 3: Design the threshold voltage $V_{LT1}$ of the CMOS inverter which consists of PMOSFET $M_1$ and NMOSFET $M_2$. That is, when the source of the NMOSFET $M_2$ has been grounded, the constant of the parameter is determined as:

$$V_{LT1} = \frac{\alpha(V_{DD} + V_{thPO}) + V_{thNO}}{1 + \alpha} \approx \frac{1}{2} V_{DD}$$

when the source of the NMOSFET $M_2$ has been connected to the base of the transistor $Q_2$, the threshold voltage should be designed in accordance with the equation (2) mentioned earlier.

Step 4: Resistance R over the range mentioned in Step 2 is used so that the threshold voltage $V_{LT2}$ of the NMOSFET $M_3$ will approach the threshold voltage $V_{LT1}$ that is set in Step 3, and values $\beta_{NO}$, $W_N/L_N$ are set in accordance with the equation (12), such that $V_{LT1} \approx V_{LT2}$. Here, however, $\beta_{NO}$ serves as a constant that does not change once the manufacturing process is determined. In practice, therefore, $V_{LT1} \approx V_{LT2}$ is accomplished by changing $W_N/L_N$ of NMOSFET $M_3$.

Described below is a concrete example when the above-mentioned design procedure is followed (where the source of NMOSFET $M_2$ is grounded in FIG. 2).

Step 1: Set $V_{thNO}$ of NMOSFET's $M_2$ and $M_3$ to be equal to each other.

Step 2: Set the resistance R to be $8K\Omega$ so that the turn-on and turn-off times of the transistor $Q_2$ will be shorter than 1.25 nsec.

Step 3: Set the value $W_P/L_P$ of PMOSFET $M_1$ constituting the CMOS inverter to be 30/2, and set the value $W_N/L_N$ of NMOSFET $M_2$ to be 10/2.

Here, $$\beta_{PO} = 10 \times 10^{-6} \frac{[\,]}{[V]}$$

$$\beta_{NO} = 30 \times 10^{-6} \frac{[\,]}{[V]}$$

$$\alpha = \sqrt{\frac{10 \times 30/2}{30 \times 10/2}} = \sqrt{1} = 1$$

$V_{DD} = 5$ volts

Therefore, $$V_{LT1} = \frac{\alpha(V_{DD} + V_{thPO}) + V_{thNO}}{1 + \alpha}$$

$$= \frac{5 + (-0.6) + 0.6}{2} = 2.5 \ (V)$$

Step 4: From the equation (12), there is obtained, $$V_{LT2} - V_{BE} - V_{thN} = \sqrt{\frac{2V_{BE}}{\beta_{NO} \frac{W_N}{L_N} \cdot R}} \quad (13)$$

Since $V_{LT1} = 2.5 \ V \approx V_{LT2}$, if
$V_{LT2} = 2.5 \ V$
$V_{BE} = 0.6 \ V$
$V_{thN} = 0.6 \ V$ are inserted into the equation (13), there is obtained, $$(1.3)^2 = \frac{1.2 \ [V]}{30 \times 10^{-6} \frac{[v]}{[V]} \cdot \frac{W_N}{L_N} \cdot 8 \times 10^3 (\Omega)} \quad (14)$$

If $W_N/L_N$ is found from the equation (14), we obtain $W_N/L_N \approx 5/2$. That is, the value $W_N/L_N$ of NMOSFET $M_3$ should be set to 5/2.

The above-mentioned structure makes it possible to obtain the following effects in addition to the effects mentioned in the paragraph of Background of the Invention.

(1) The threshold voltage $V_{thNO}$ (when there is no substrate effect) of NMOSFET $M_2$ constituting the CMOS inverter 12 is set to be substantially equal to the threshold voltage $V_{thNO}$ (when there is no substrate effect) of NMOSFET $M_3$. This means that the NMOSFET's $M_2$ and $M_3$ can be formed simultaneously in the semiconductor substrate through the same manufacturing process, thereby simplifying the manufacture of integrated circuits.

(2) Resistance of the resistor R is so determined that the bipolar transistor $Q_2$ in the output stage exhibits a turn-on time and a turn-off time of desired values (high speeds). Therefore, the high switching speed of the transistor $Q_2$ is correctly determined.

(3) Value $W_N/L_N$ of the NMOSFET $M_3$ is so adjusted that the logic threshold voltage $V_{LT2}$ of NMOSFET $M_3$ approaches the logic threshold voltage $V_{LT1}$ of the CMOS inverter. Therefore, the two transistors $Q_1$ and $Q_2$ in the output stage are driven at nearly the same timing in a complementary manner, making it possible to minimize the through current that flows instantaneously through the transistors $Q_1$, $Q_2$.

Embodiment 2

Figure 5:
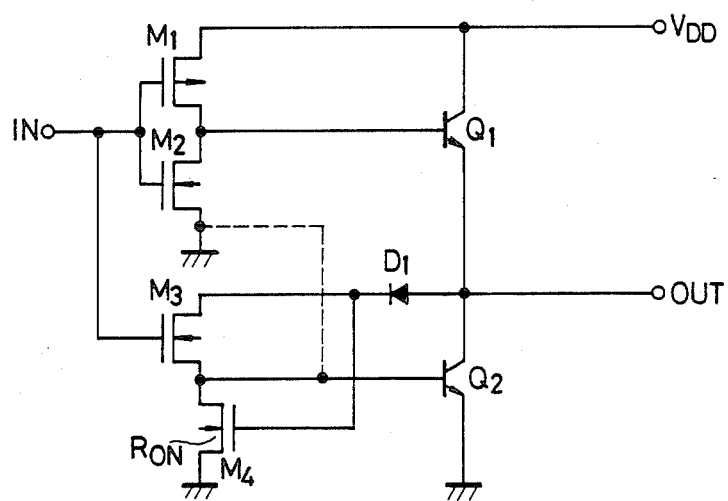
FIG. 5 is a circuit diagram illustrating a second embodiment of the present invention.

FIG. 5 shows the structure of a switching circuit according to a second embodiment of the present invention. What makes this embodiment different from the circuit structure of embodiment 1 is that the resistor R in this embodiment is formed by utilizing the resistance of a MOSFET $M_4$ while it is conductive.

Similar to embodiment 1, the circuit in this embodiment is designed in five steps.

Step 1: The threshold voltage $V_{thNO}$ of NMOSFET $M_2$ is set to be substantially equal to the threshold voltage $V_{thNO}$ of NMOSFET $M_3$ Step 2: To set $t_{ON}$ of the transistor $Q_2$ (time required for turning $Q_2$ from off to on) to be shorter than a predetermined value, the resistance R of NMOSFET $M_4$ while it is conductive is set to lie within a predetermined range.

To set $t_{ON}$ to be shorter than 2 nsec., R must be greater than 1KΩ.

To set $t_{ON}$ to be shorter than 1.5 nsec., R must be greater than 3 KΩ.

To set $t_{ON}$ to be shorter than 1.25 nsec., R must be greater than 4KΩ.

Step 3: In order to set $t_{OFF}$ required for turning the transistor $Q_2$ from on to off to be shorter than a predetermined value, the resistance R of NMOSFET $M_4$ when it is turned from off to on is set to lie within a predetermined range, the NMOSFET $M_4$ being driven by a current that flows through a path consisting of input terminal IN, PMOSFET $M_1$, and transistor $Q_1$.

To set $t_{OFF}$ to be shorter than 2 nsec., $R \leq 30$ KΩ.

To set $t_{OFF}$ to be shorter than 1.5 nsec., $R < 20$KΩ.

To set $t_{OFF}$ to be shorter than 1.25 nsec., $R < 16$KΩ.

Step 4: Design the threshold voltage $V_{LT1}$ of the CMOS inverter consisting of $M_1$ and $M_2$. When the source of NMOSFET $M_2$ is grounded, design the threshold voltage according to the following equation, $$V_{LT1} = \frac{a(V_{DD} + V_{thPO}) + V_{thNO}}{1 + a} \approx \tfrac{1}{2} V_{DD}$$

When the source of NMOSFET $M_2$ is connected to the base of the transistor $Q_2$, design the threshold voltage according to the aforementioned equation (2).

Step 5: Use the resistance R of NMOSFET $M_4$ over the ranges of Steps 2 and 3, that $V_{LT2}$ will approach $V_{LT1}$ that has been set in Step 4, and set $\beta_{NO}$ and $W_N/L_N$ in accordance with the equation (12) to accomplish the relation $V_{LT1} \approx V_{LT2}$.

Embodiment 3

Figure 6:
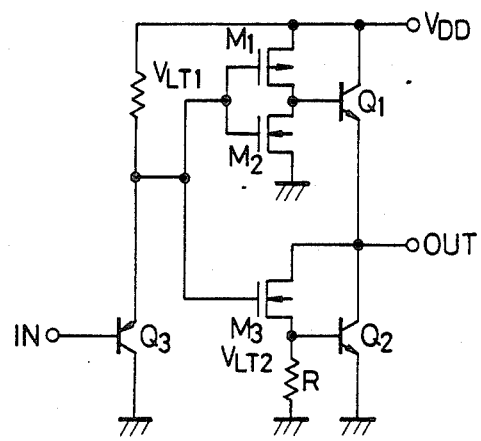
FIG. 6 is a circuit diagram illustrating a third embodiment of the present invention.

FIG. 6 is a diagram showing a switching circuit according to a third embodiment of the present invention.

The feature of this circuit resides in the provision of a collector-grounded pnp-type bipolar transistor $Q_3$ in the input portion.

If the circuit is based on the prerequisite that an input signal (high level $V_1H=2.0$ V, threshold level $V_{Ith}=1.3$ V, low level $V_1L=0.8$ V) of the TTL level is applied to the input terminal IN, the threshold voltage $V_{Ith}$ of the transistor $Q_3$ must be set to 1.3 volts. In this case, the design should be carried out according to Steps 1 to 4, such that $V_{LT1}=V_{LT2}=V_{Ith}+V_{BE}=1.3$ V + 0.6 V = 1.9 volts.

Embodiment 4

Figure 7:
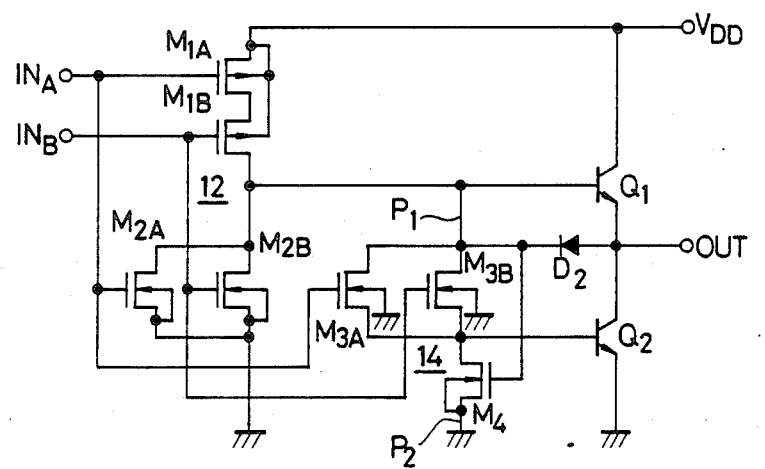
FIG. 7 is a circuit diagram illustrating a fourth embodiment of the present invention.

According to this embodiment, shown in FIG. 4, the switching circuit is provided with a NOR logic function for a pair of input signals $IN_A$ and $IN_B$ relying upon a plurality of MOSFET's M1A, M1B, M2A, M2B, M3A and M3B. As can be seen in FIG. 7, the input $IN_A$ is coupled to the gates of M1A, M2A and M3A while the input $IN_B$ is coupled to the gates of M1B, M2B and M3B for similarly producing an output. By virtue of the series connection of M1A and M1B and the parallel connections of M2A and M2B as well as M3A and M3B, a NOR output at OUT will be produced for the inputs $IN_A$ and $IN_B$. The transistor $M_4$ serves as the resistor R in this circuit in a manner similar to FIG. 5.

The design procedure for setting values for the transistors and the resistance is the same as the one described above.

Although particular values for voltages, resistances and dimensions have been provided in the foregoing description, it is to be understood that these are for purposes of example in conjunction with the described embodiments, and the present invention is not necessarily limited to such values. On the contrary, the principles and steps provided in the foregoing description can be used to design switching circuits having reduced through current for a variety of different values.

Also, although the invention is described in terms of MOSFET's (technically meaning Metal-Oxide-Semiconductor FETs), it is to be understood that this is done in the more general meaning now attached to this term, which includes other IGFETs (Insulated-Gate FETs) which may have their gates formed of material other than metal (e.g. doped polycrystalline silicon) and their gate insulation formed of material other than oxide (e.g. $Si_3N_4$).

Further, although the fourth embodiment has been provided to show connection of the elements of the present invention in a logic NOR configuration, it is to be understood that the circuit could be arranged to provide other logic functions, if desired, while still operating with the CMOS inverter arrangement and source follower arrangement discussed for this invention.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A switching circuit comprising:
   (1) first and second bipolar transistors having collector-emitter paths which are connected in series across a first operation potential point and a second operation potential point to provide an output signal for said switching circuit;
   (2) a CMOS inverter circuit connected between an input terminal of said switching circuit and a base of the first bipolar transistor; and
   (3) a source follower circuit connected between said input terminal and a base of said second bipolar transistor,
   wherein:
   said CMOS inverter circuit has a first MOSFET of the first type of conductivity and a second MOSFET of the second type of conductivity;

said source follower circuit has a third MOSFET of the second type of conductivity and resistance means;

said second MOSFET and said third MOSFET have a substantially equal logic threshold voltage $V_{thNO}$ in the absence of substrate effect;

said resistance means has a predetermined resistance such that a turn-on and a turn-off time of said second bipolar transistor are shorter than a predetermined value;

said first MOSFET and said second MOSFET have predetermined logic threshold voltage $V_{thPO}$, $V_{thNO}$ in the absence of substrate effect, and channel conductances $W_P/L_P$, $W_N/L_N$, such that said CMOS inverter will have a desired logic threshold voltage $V_{LT1}$;

the channel conductance $W_N/L_N$ of said third MOSFET is so set that the logic threshold voltage $V_{LT2}$ of said source follower circuit will be substantially equal to said desired logic threshold voltage $V_{LT1}$ of said CMOS inverter; and wherein said output signal is provided at an output terminal coupled between the respective collector-emitter paths of said first and second bipolar transistors.

2. A switching circuit according to claim 1, wherein said resistance means is comprised of a fourth MOSFET, a gate thereof being controlled by the level of an output signal produced by the switching circuit.

3. A switching circuit according to claim 1, further comprising a collector-grounded pnp-type transistor having an emitter connected to the gates of the first, second and third MOSFETs and having a gate coupled to receive an input signal for said switching circuit.

4. A switching circuit according to claim 1, wherein said first and second MOSFETs are coupled to have their gates both coupled to said input terminal and their sourcedrain paths coupled in series with one another between said first operation potential and said second operation potential.

5. A switching circuit according to claim 4, wherein said third MOSFET has a gate coupled to said input terminal, wherein said resistance means is coupled to the source of said third MOSFET and wherein said base of said second bipolar transistor is coupled to a junction between said source of said third MOSFET and said resistance means.

6. A switching circuit according to claim 1, wherein said third MOSFET has a gate coupled to said input terminal, wherein said resistance means is coupled to the source of said third MOSFET and wherein said base of said second bipolar transistor is coupled to a junction between said source of said third MOSFET and said resistance means.

7. A switching circuit according to claim 1, wherein said third MOSFET has a gate coupled to said input terminal, wherein said resistance means is coupled to the source of said third MOSFET and wherein said base of said second bipolar transistor is coupled to a junction between said source of said third MOSFET and said resistance means, and further wherein said first and second MOSFETs are coupled to have their gates both coupled to said input terminal and their source-drain paths coupled in series between said first operating point and said junction between said source of said third MOSFET, said resistance means and said base of said second bipolar transistor.

8. A switching circuit according to claim 1, wherein a plurality of said first MOSFETs, a plurality of said second MOSFETs and a plurality of said third MOSFETs are provided, wherein a first input terminal for receiving a first input signal is coupled to provide said first input signal to predetermined ones of said first, second and third MOSFETs while a second input terminal for receiving a second input signal is coupled to provide said second input signal to predetermined different ones of said first, second and third MOSFETs, and wherein said plurality of first, second and third MOSFETs are arranged to provide a logic function output for said first and second input signals.

9. A switching circuit according to claim 8, wherein said plurality of first MOSFETs are arranged in series with one another, and wherein said plurality of second MOSFETs and said plurality of third MOSFETs are arranged in parallel to one another so that said switching circuit provides a NOR logic function output for said first and second input signals.

* * * * *